United States Patent
Gilhotra

(10) Patent No.: US 10,785,426 B2
(45) Date of Patent: Sep. 22, 2020

(54) APPARATUS AND METHODS FOR GENERATING HIGH DYNAMIC RANGE IMAGES

(71) Applicant: SEMICONDUCTOR COMPONENTS INDUSTRIES, LLC, Phoenix, AZ (US)

(72) Inventor: Pawan Gilhotra, Newark, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 23 days.

(21) Appl. No.: 15/980,327

(22) Filed: May 15, 2018

(65) Prior Publication Data
US 2019/0356871 A1    Nov. 21, 2019

(51) Int. Cl.
*H04N 5/355*    (2011.01)
*H04N 5/378*    (2011.01)

(52) U.S. Cl.
CPC ............. *H04N 5/355* (2013.01); *H04N 5/378* (2013.01)

(58) Field of Classification Search
CPC ............................... H04N 5/355; H04N 5/378
See application file for complete search history.

(56) References Cited

U.S. PATENT DOCUMENTS

| | | | | |
|---|---|---|---|---|
| 7,202,463 | B1* | 4/2007 | Cox | H04N 5/335 250/208.1 |
| 10,362,256 | B2* | 7/2019 | Endsley | H04N 5/378 |
| 2006/0176205 | A1* | 8/2006 | Kawahito | H03M 1/164 341/155 |
| 2008/0023623 | A1 | 1/2008 | Davidovici | |
| 2009/0153715 | A1* | 6/2009 | Deschamps | H04N 5/35554 348/308 |
| 2009/0160987 | A1* | 6/2009 | Bechtel | H04N 5/353 348/302 |
| 2010/0194956 | A1* | 8/2010 | Yuan | H04N 5/35527 348/308 |
| 2014/0103189 | A1 | 4/2014 | Chen et al. | |
| 2015/0070544 | A1* | 3/2015 | Smith | H04N 5/378 348/297 |
| 2015/0201139 | A1 | 7/2015 | Funatsu et al. | |
| 2017/0208272 | A1* | 7/2017 | Guidash | H04N 5/353 |
| 2018/0364373 | A1* | 12/2018 | Hondongwa | H04N 5/3745 |

* cited by examiner

*Primary Examiner* — Jason A Flohre
(74) *Attorney, Agent, or Firm* — Treyz Law Group, P.C.; Tianyi He

(57) ABSTRACT

An image sensor pixel may include a photodiode, a floating diffusion, and a transfer gate. Column readout circuitry coupled to the image sensor pixel via a column line. The column readout circuitry may include sample and hold circuitry, comparison circuitry, residual measurement and summation circuitry, counter circuitry, analog-to-digital conversion circuitry, and digital summation circuitry. Column readout circuitry is configured to perform readout operations on a pixel image signal generated for a single frame in one or more portions, thereby extending the dynamic range of the imaging system without modifying pixel structure to generate high-dynamic range images within the single frame.

17 Claims, 8 Drawing Sheets

APPARATUS AND METHODS FOR GENERATING HIGH DYNAMIC RANGE IMAGES

BACKGROUND

This relates generally to imaging devices, and more particularly, to imaging devices having high dynamic range image generation capabilities.

Image sensors are commonly used in electronic devices such as cellular telephones, cameras, and computers to capture images. In a typical arrangement, an electronic device is provided with an array of image pixels arranged in pixel rows and pixel columns. The image pixels contain a photodiode for generating charge in response to light (e.g., by photoelectric conversion). Circuitry is commonly coupled to each pixel column for reading out image signals from the image pixels.

In general, image scenes have bright and dim portions that are difficult to correctly capture in a single image frame (e.g., because of image overexposure and/or underexposure). As a result, image sensors are typically configured to capture a short exposure time image frame and a long exposure time image frame and selectively combine the two frames to generate a high dynamic range (HDR) image capturing both the bright and dim portions of the image scene. However, by having to capture multiple image frames to generate a single HDR image, the image sensor experiences reduced image capturing efficiency (e.g., lower frames per second) and requires additional storage to store the long exposure and/or short exposure images.

It would therefore be desirable to provide imaging systems with improved high dynamic range image generation capabilities.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
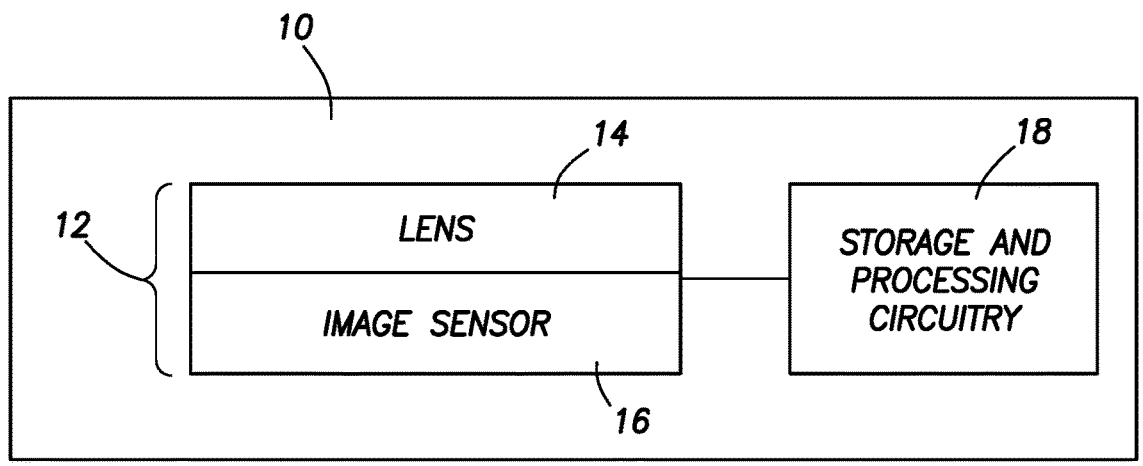
FIG. 1 is a diagram of an illustrative electronic device having an image sensor and processing circuitry for capturing images using a pixel array in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
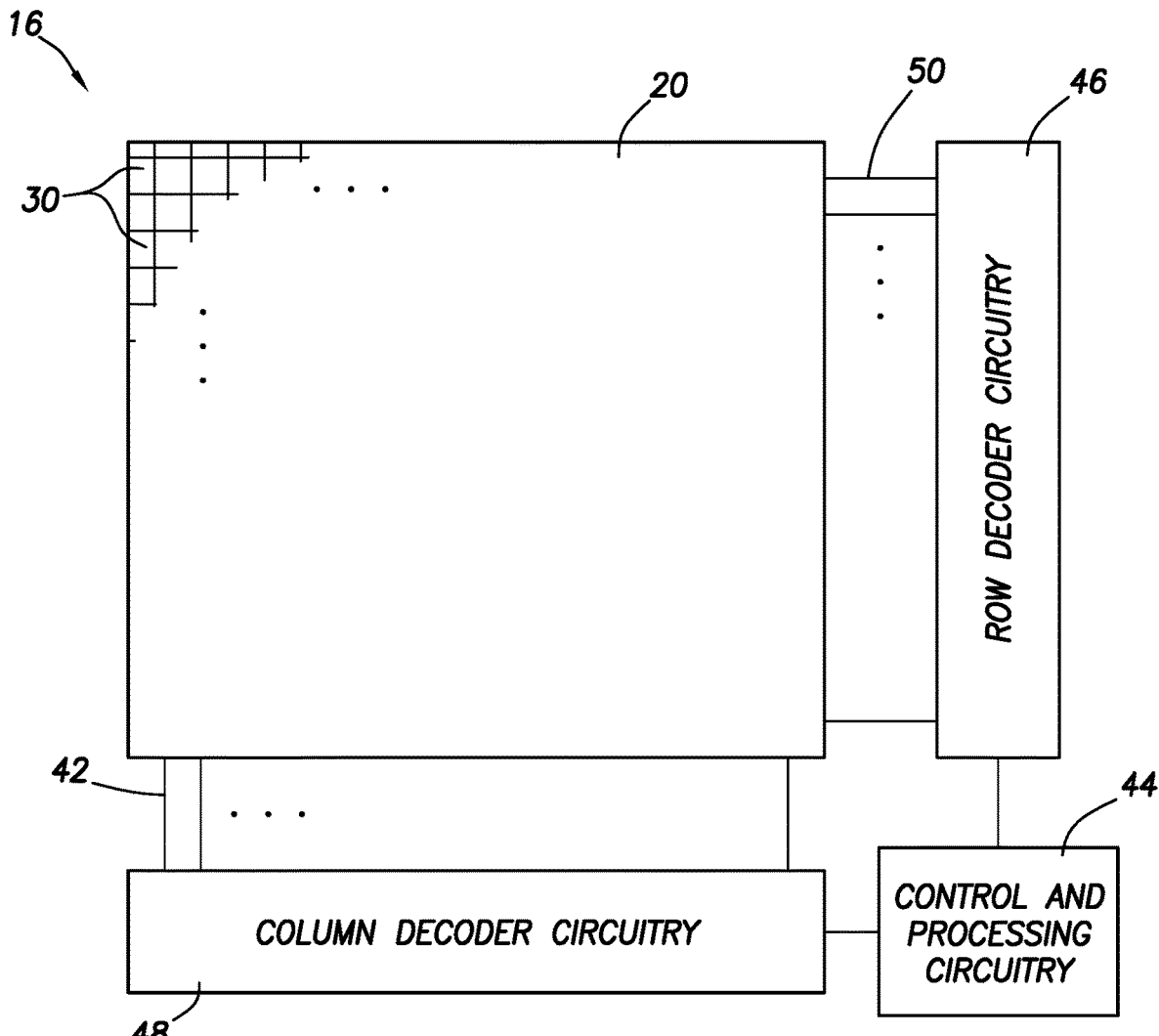
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 30 (sometimes referred to herein as image pixels or pixels) arranged in rows and columns and control and processing circuitry 44 (which may include, for example, image signal processing circuitry). Array 20 may contain, for example, hundreds or thousands of rows and columns of image sensor pixels 30. Control circuitry 44 may be coupled to row control circuitry 46 (sometimes referred to herein as row decoder circuitry or row circuitry) and column readout circuitry 48 (sometimes referred to herein as column control circuitry, readout circuitry, processing circuitry, or column decoder circuitry). Row control circuitry 46 may receive row addresses from control circuitry 44 and supply corresponding row control signals such as reset, row-select, charge transfer, dual conversion gain, and readout control signals to pixels 30 over row control lines 50. One or more conductive lines such as column lines 42 may be coupled to each column of pixels 30 in array 20. Column lines 42 may be used for reading out image signals from pixels 30 and for supplying bias signals (e.g., bias currents or bias voltages) to pixels 30. If desired, during pixel readout operations, a pixel row in array 20 may be selected using row control circuitry 46 and image signals generated by image pixels 30 in that pixel row can be read out along column lines 42.

Image readout circuitry 48 may receive image signals (e.g., analog pixel values generated by pixels 30) over column lines 42. Image readout circuitry 48 may include sample and hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 30 and for reading out image signals from pixels 30. ADC circuitry in readout circuitry 48 may convert analog pixel values received from array 20 into corresponding digital pixel values (sometimes referred to as digital image data or digital pixel data). Image readout circuitry 48 may supply digital pixel data to control and processing circuitry 44 and/or processor 18 (FIG. 1) for pixels in one or more pixel columns.

If desired, a color filter array may be formed over photosensitive regions in array 20 so that a desired color filter element in the color filter array is formed over an upper surface of the photosensitive region of an associated pixel 30. A microlens may be formed over an upper surface of the color filter array to focus incoming light onto the photosensitive region associated with that pixel 30. Incoming light may be focused onto the photosensitive region by the microlens and may pass through the color filter element so that only light of a corresponding color is captured at the photosensitive region. If desired, an optional masking layer may be interposed between the color filter element and the microlens for one or more pixels 30 in array 20. In another suitable arrangement, an optional masking layer may be interposed between the color filter element and the photosensitive region for one or more pixels 30 in array 20. The masking layers may include metal masking layers or other filtering layers that block a portion of the image light from being received at the photosensitive region. If desired, image pixels 30 may be formed without any masking layers.

If desired, pixels 30 in array 20 of FIG. 2 may be provided with an array of color filter elements that each pass one or more colors of light. All or some of pixels 30 may be provided with a color filter element. Color filter elements for pixels 30 may be red color filter elements (e.g., photoresist material that passes red light while reflecting and/or absorbing other colors of light), blue color filter elements (e.g., photoresist material that passes blue light while reflecting and/or absorbing other colors of light), and/or green color filter elements (e.g., photoresist material that passes green light while reflecting and/or absorbing other colors of light). Color filter elements may also be configured to filter light that is outside the visible human spectrum. For example, color filter elements may only allow infrared light or ultraviolet light to reach the photodiode. Color filter elements may configure image pixel 30 to only detect light of a certain wavelength or range of wavelengths and may be configured to allow multiple wavelengths of light to pass while blocking light of certain other wavelengths (for example, light having a wavelength that corresponds to a certain visible color and/or an infrared or ultraviolet wavelength).

Color filter elements that pass two or more colors of light (e.g., two or more colors of light selected from the group that includes red light, blue light, and green light) are sometimes referred to herein as "broadband" filter elements. For example, yellow color filter elements that are configured to pass red and green light and clear color filter elements that are configured to pass red, green, and blue light may be referred to herein as broadband filter elements or broadband color filter elements. Similarly, image pixels that include a broadband color filter element (e.g., a yellow, magenta, or clear color filter element) and that are therefore sensitive to two or more colors of light (e.g., that capture image signals in response to detecting two or more colors of light selected from the group that includes red light, blue light, and green light) may sometimes be referred to herein as broadband pixels or broadband image pixels.

As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. These examples are merely illustrative and, in desired, color filter elements of any suitable color and in any suitable pattern may be formed over any suitable number of image pixels 30.

Figure 3:
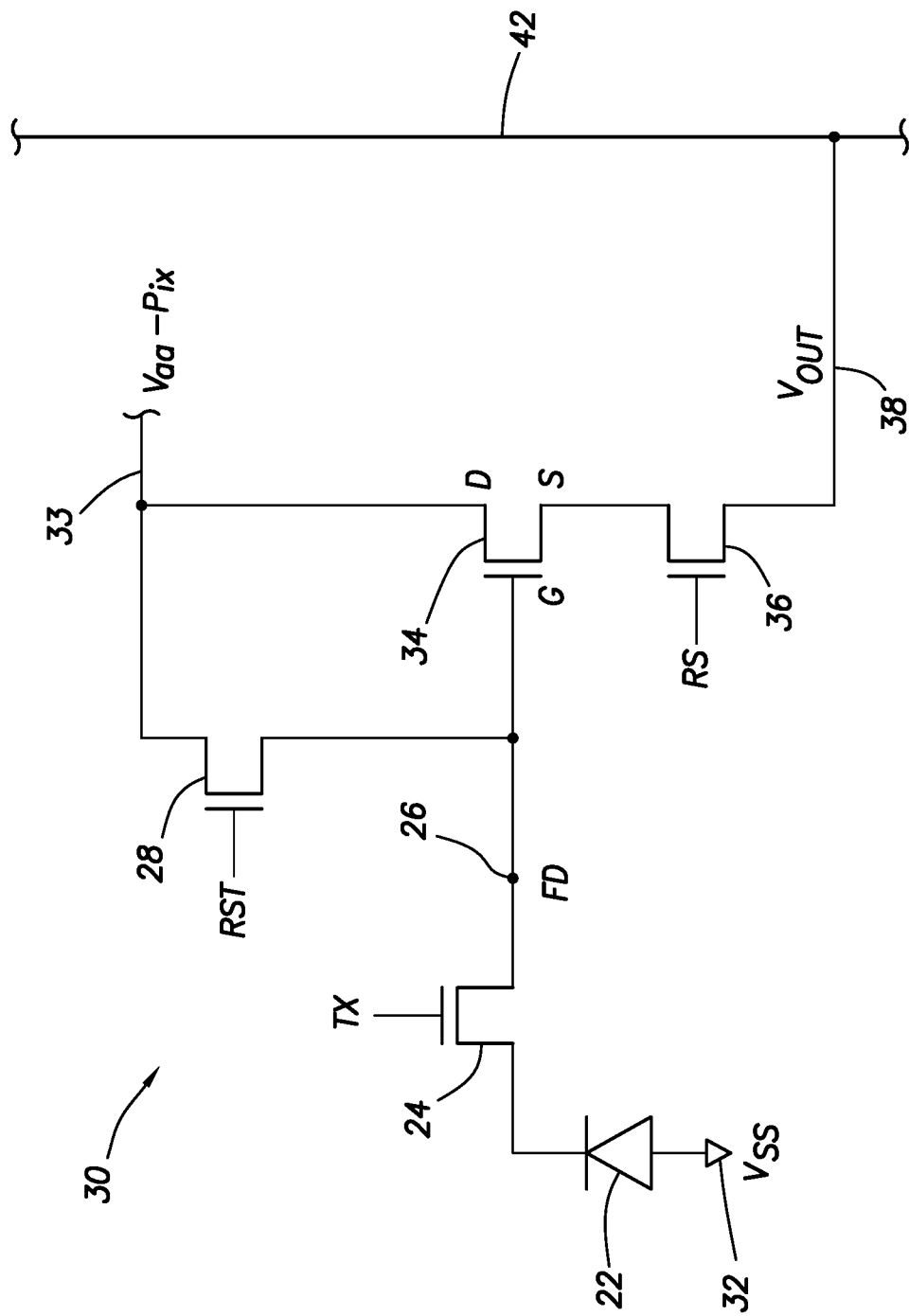
FIG. 3 is a schematic diagram of an illustrative image sensor pixel in accordance with an embodiment.

Circuitry in an illustrative image pixel 30 of image pixel array 20 is shown in FIG. 3. As shown in FIG. 3, pixel 30 may include a photosensitive element such as photodiode 22 (sometimes referred to herein as photodetector 22). A positive pixel power supply voltage (e.g., voltage Vaa_pix) may be supplied at positive power supply terminal 33. A ground power supply voltage (e.g., Vss) may be supplied at ground power supply terminal 32. Incoming light may be gathered by photodiode 22 after passing through a color filter structure. Photodiode 22 may convert the light to electrical charge. Photodiode 22 may be reset to a reset voltage (e.g., a positive power supply voltage) before image acquisition.

Additionally, before an image is acquired, reset control signal RST may be asserted (e.g., asserted-high to activate a corresponding transistor). This turns on reset transistor 28 and resets charge storage node 26 (also referred to as floating diffusion FD or floating diffusion region FD) to a reset voltage level (e.g., a voltage level equal or close to voltage level Vaa_pix). The reset control signal RST may then be deasserted (e.g., asserted-low to deactivate a corresponding transistor) to turn off reset transistor 28. After the reset process is complete, transfer gate control signal TX may be asserted to turn on transfer transistor (transfer gate) 24. When transfer transistor 24 is turned on, the charge that has been generated by photodiode 22 in response to incoming light is transferred to charge storage node 26.

Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) may exhibit a capacitance that can be used to store the charge that has been transferred from photodiode 22. The signal associated with the stored charge on node 26 may be buffered by source-follower transistor 34. Row select transistor 36 may connect the source follower transistor 34 to column output line 42.

If desired, other types of image pixel circuitry may be used to implement the image pixels of image sensor 16. For example, each image sensor pixel 30 (see, e.g., FIG. 1) may be a three-transistor pixel, a pinned-photodiode pixel with four transistors, a global shutter pixel, a rolling shutter pixel, a pixel with light-flickering mitigation capabilities and/or charge overflow capabilities, etc. The circuitry of FIG. 3 is merely illustrative.

When it is desired to read out the value of the stored charge (i.e., the value of the stored charge that is represented by the signal at the source S of transistor 34), row select control signal RS can be asserted. When control signal RS is asserted, transistor 36 is turned on and a corresponding signal Vout that is representative of the magnitude of the charge on charge storage node 26 is produced on output path 38. There may be numerous rows and columns of pixels such as pixel 30 in the image sensor pixel array of a given image sensor. A conductive path such as output line 42 may be associated with one column of image pixels 30. When control signal RS is asserted in a given pixel 30, output line 42 can be used to route signal Vout from the pixel 30 to readout circuitry (e.g., readout circuitry 48 in FIG. 2).

Because floating diffusions 26 of respective pixels 30 may have finite capacitances (e.g., limited charge storage capacities), for a single exposure frame (e.g., during a particular exposure time period), image signals generated by a portion of the pixels 30 may be subject to light overexposure, and a portion of the pixels 30 may be subject to light underexposure. It may therefore be difficult for pixels 30 to accurately translate dark and bright spots into corresponding dark and bright image data using the single exposure frame and generate an HDR image having desirable characteristics. While multiple exposure frames (e.g., each having a separate exposure time period) may be used to generate an HDR image, it is time inefficient and requires additional storage for the multiple exposure frames.

Figure 4:
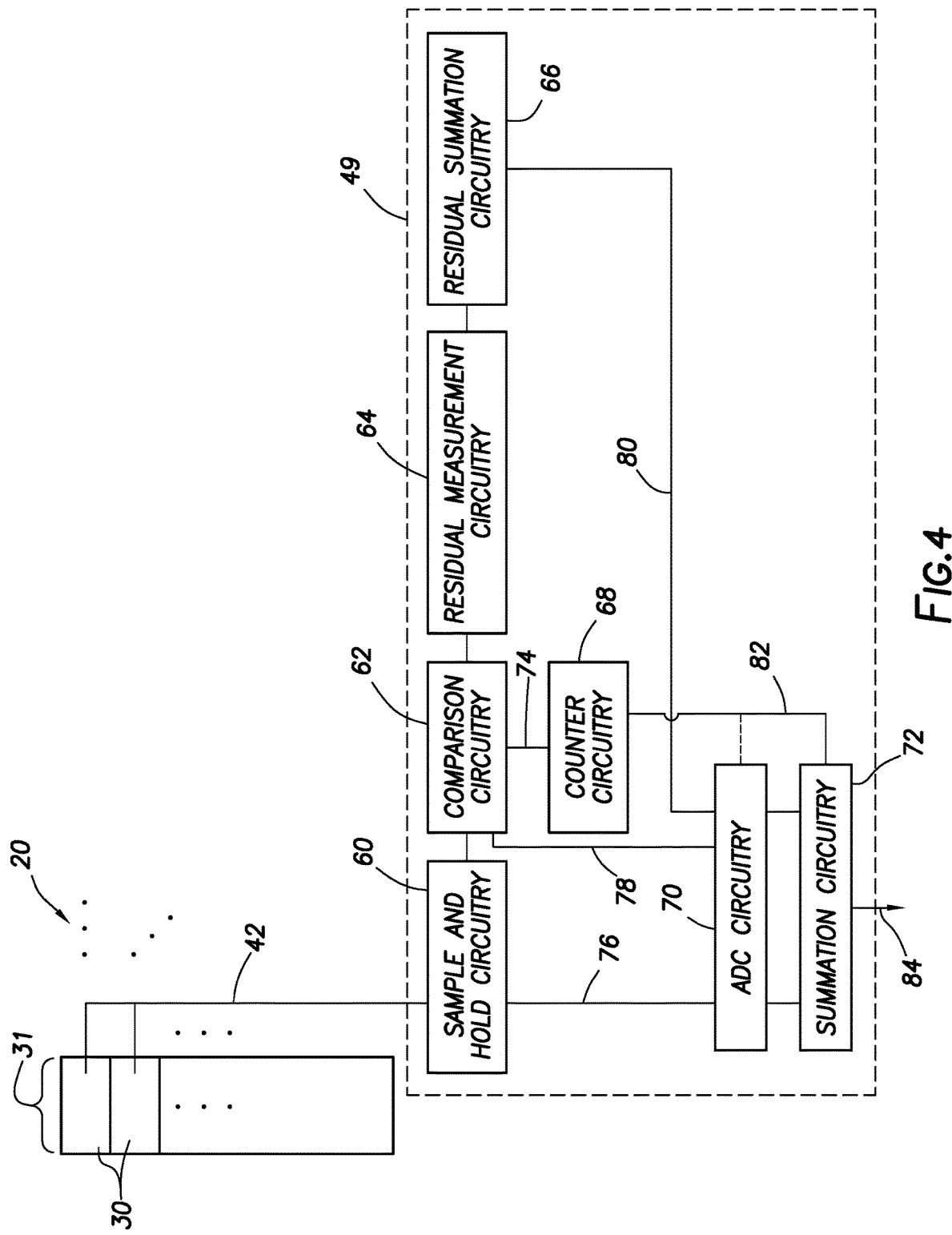
FIG. 4 is a block diagram of an illustrative system that includes readout circuitry and image pixels in an image sensor and that is configured to extend the dynamic range functionalities of the image sensor in accordance with an embodiment.

FIG. 4 shows an illustrative system configured to generate an HDR image using an image generated from a single exposure time period. In particular, pixel array 20 may include a column of pixels 30 (e.g., pixel column 31 or simply column 31). Pixels 30 in column 31 are coupled to column readout circuit 49 via shared pixel output line 42. Readout circuit 49 may form a portion of column readout circuitry 48 in FIG. 2. As an example, each column in pixel array 20 may be coupled to an analogous column readout circuit 49. In other words, readout circuit 49 may be provided on a per-column basis. This is merely illustrative. If desired, a single readout circuit 49 may be shared by multiple columns in array 20 (e.g., circuit 49 may be shared by two columns of pixels 30, may be shared by three or more columns of pixels 30, etc.). If desired, only a portion of pixels 30 in column 31 (e.g., one pixel, two pixels, three or more pixels, etc.) may be coupled to (e.g., share) readout circuit 49.

Readout circuit 49 may include sample and hold circuitry 60 (sometimes referred to herein as S/H circuitry or sample-and-hold circuitry), comparison circuitry 62, residual voltage measurement circuitry 64 (sometimes referred to herein as residual charge measurement circuitry, residual measurement circuitry), residual summation circuitry 66 (sometimes referred to herein as residual charge accumulation circuitry, residual voltage summation circuitry), counter circuitry 68 (e.g., a counter circuit, a digital counter), analog-to-digital conversion (ADC) circuitry 70, digital summation circuitry 72 (sometimes referred to herein as addition circuitry). Readout circuit 49 is configured to read out pixel generated charge as a pixel image signal for a single frame in one or more targeted sizes or portions (e.g., photodiode 22 may transfer pixel generated charge for a single frame to floating diffusion 26 in one or more portions to be read out by readout circuit 49). In particular, sample and hold circuitry 60 may include an image signal voltage S/H circuit that reads out a first portion of the pixel image signal. Sample and hold circuitry 60 may also include a reset signal voltage S/H circuit that reads out a reset signal voltage (e.g., a reset voltage level such as voltage level Vaa_pix in FIG. 3). Sample and hold circuitry 60 may further include a reference voltage storage circuit. The reference voltage storage circuit may store a reference signal voltage (e.g., a reference voltage level) that corresponds to the target magnitude of the portion of the pixel image signal sampled by sample and hold circuitry 60 during a given readout portion. If desired, the reference signal voltage may be selected such that it corresponds to less than a pixel output line signal voltage associated with floating diffusion 26 at full charge storage capacity. In other words, the reference signal voltage is selected such that each target amount of generated charge readout never exceeds the storage capacity of floating diffusion 26, thereby avoiding any overflow effects and artificially extending the dynamic range of floating diffusion 26.

As an example, photodiode 22 in FIG. 2 may have generated 22,000 electrons during image acquisition. Sample and hold circuitry 60 may attempt read out an allotted or target number of 6,000 electrons in each of the multiple readout portions (e.g., transfer transistor 24 may attempt to transfer 6,000 electrons from photodiode 22 to floating diffusion 26 in multiple approximately-6,000-electrons portions to be read out by stored at S/H circuitry 60). In this scenario, a voltage level difference between the reset voltage level (e.g., 1.8 V) and the reference voltage level (e.g., 1.0) may be 0.8 V, which may correspond to 6,000 electrons, as an example. Because transferring exactly an exact number of electrons to floating diffusion 26 may be difficult, transistor 24 may be configured to always transfer a small number of electrons more than the allotted or target amount (e.g., transfer 6010 electrons, transfer 6050 electrons, etc.) to be read out.

Sample and hold circuitry 60 may be coupled to comparison circuitry 62 via one or more paths. Comparison circuitry 62 may receive the portion of the pixel image signal (as an image readout voltage), the reset voltage signal (as a reset signal voltage), the reference voltage signal (as a reference signal voltage), a relative difference signal between the reference signal and a given reset voltage signal (e.g., the reference signal voltage subtracted from the given reset signal voltage), other relative difference signals, and any other suitable signals from sample and hold circuitry 60. Comparison circuitry 62 may perform comparison operations to determine whether additional portions of the generated charge (that can be read out as additional portions of pixel image signal) remain in photodiode 22 in pixel 30. In particular, comparison circuitry 62 may compare the relative reference-to-reset difference voltage with the image readout voltage associated with the currently readout portion of the pixel image signal. The relative reference-to-reset difference voltage (sometimes referred to herein as a target output line swing voltage at output line 42) is compared with the image signal because the image signal read out of pixel 30 is generated relative to the reset voltage level (e.g., floating diffusion 26 is reset before receiving light generated charge).

If comparison circuitry 62 determines that additional portions of the generated charge remain in pixel 30, comparison circuitry 62 may provide a first (asserted) control signal to sample and hold circuitry, a second (asserted) control signal to counter circuitry 68 (e.g., via path 74), and a third (asserted) control signal to residual measurement circuitry 64. In response to the first control signal, sample and hold circuitry 60 may reset the reset signal S/H circuit and the image signal S/H circuit (e.g., removing any stored reset and image signal voltages in the respective S/H circuits). In response to the second control signal, counter circuitry 68 may update a count value stored at counter circuitry 68. As an example, counter circuitry 68 may be initialized or reset to initially store a count value of zero before pixel image readout operations begin. In this example, each time counter circuitry 68 receive an asserted second control signal, the count value may be incremented by one. This example is merely illustrative. If desired, any counter circuitry may be implemented to keep track of a number of times the second control signal is asserted during readout for a single pixel image. As an example, analog counting circuitry may be used in counter circuitry 68.

The third control signal may serve as an activation or enable signal for residual measurement circuitry 64. As previously noted, an actual amount of pixel generated charge (e.g., 6010 electrons) read out will be larger than the target amount of charge (e.g., 6000 electrons) associated with the pixel output line target swing voltage, if possible. In other words, a currently read out portion of the pixel image signal may be larger than the target swing voltage. As such, residual measurement circuitry 64 may determine the difference between the image readout voltage (i.e., the currently read out portion of the pixel image signal) and the target swing voltage to generate a residual signal (e.g., a residual signal voltage level). Residual measurement circuitry 64 may provide the residual signal voltage to residual summation circuitry 66.

As more than one portion of the pixel image signal readout may include a respective residual voltage signal, residual summation circuitry 66 may store and add each of the respective residual voltage signals for respective readout portions of the pixel image signal. As an example, residual summation circuitry 66 may be initialized or reset to initially store zero residual voltage signals before pixel image readout operations begin but may add or accumulate a respective residual voltage signal as generated by residual measurement circuitry 64. This example is merely illustrative. If desired, any suitable accumulation or summation scheme may be used in residual summation circuitry 66.

Comparison circuitry 62 may also be coupled to ADC circuitry 70 via path 78. If desired, when it is determined that additional portions of the generated charge remain in pixel 31, comparison circuitry 62 may provide a control signal to deactivate a portion of ADC circuitry 70 such that ADC circuitry 70 does not perform conversion operations on the currently held signals at sample and hold circuitry 60 (e.g., signals stored at sample hold circuitry 60 before receiving the first control signal from comparison circuitry 62).

In the scenario where one or more additional portions of the generated charge remain in pixel 31, column readout circuit 49 may continue to read out an additional portion of the pixel image signal. In particular, sample and hold circuitry 60 may sample and hold a reset voltage level at the reset voltage S/H circuit, and sample and hold the additional portion of the pixel signal at the reset voltage S/H circuit. Sample and hold circuitry 60 may continue to store and use the previously stored reference signal (although in reference to the new reset voltage level). In particular, while reading out all portions of the pixel image signal, the same reference signal may be used (e.g., the same target swing voltage at output line 42 may be used). While reading out all portions of the pixel image signal, respective different reset signals may be readout for the corresponding portions of the pixel image signal. Comparison circuitry 62 may continue to compare the additional portion of the pixel image signal in a similar manner as described in connection with the first portion of the pixel image signal read out. In particular, because the same reference signal is used to read out each of the additional portions of the pixel image signal, the target swing voltage for each portion of the pixel image signal (e.g., the respective pixel readout voltages for each portion) read out may be the same.

When comparison circuitry 62 determines that no additional portions of the generated charge remain in pixel 31 after reading out a final portion of the pixel image signal, comparison circuitry 62 may send a first (asserted) control signal to ADC circuitry 70 (e.g., via path 78). The first control signal may activate a portion of ADC circuitry 70 to perform analog-to-digital conversion operations based on the final portion of the pixel image signal and the reset image signal associated with the final portion of the pixel image signal. When comparison circuitry 62 determines that no additional portions of the generated charge remain in pixel 31 after reading out the final portion of the pixel image signal, comparison circuitry 62 may also send a second (asserted) control signal to ADC circuitry 70 (e.g., via path 78). The second control signal may activate a portion of ADC circuitry 70 to perform analog-to-digital conversion operations based on the summed residual signal accumulated from all of the previous residual voltage signals associated with read out of previous portions of the pixel image signal. ADC circuitry 70 may perform the ADC operations based on the summed residual signal and a reference voltage (e.g., a ground voltage), as an example. In a given scenario, a first portion of the pixel image signal may be the only portion of the pixel image signal and therefore also final portion of the pixel image signal. In this particular scenario, the only portion of the pixel image signal may be read out using the final portion of the pixel image signal readout scheme.

If desired, comparison circuitry 62 may provide a third (asserted) control signal to counter circuitry 68. In response to the third control signal, counter circuitry 68 may generate digital data value that corresponds to the final count value stored at counter circuitry. In particular, each incremental step in the count value may correspond to an increment by a pre-determined digital data (e.g., digital data value 63) corresponding to the analog swing voltage associated with the target magnitude of each portion of the pixel data read out (e.g., 0.8V). If desired, the pre-determined digital data may be generated by ADC circuitry 70. A coarse digital data value (e.g., counter value 3*digital data value 63=coarse digital value 189) associated with roughly all of the previous portions before the last portion of the pixel image data (e.g., not accounting for residual voltage values) may be generated by multiplying the pre-determined digital data (e.g., value of 63) multiplied by the final count value (e.g., value of 3 because three readout portions occurred prior to the final readout portion). If desired, any other circuitry (e.g., ADC circuitry 70) may be configured to provide the multiplication operations.

Digital data summation circuitry 72 may receive a first digital data portion generated from the last portion of the pixel image data, a second digital data portion generated from the counter value, and a third digital data portion generated from the summed residual values. Digital summation circuitry 72 may combine or sum the three digital data values to generate a final digital data value on path 84. The final digital data value may correspond to the entire analog pixel image value generated for the image scene. In such a way, a pixel image signal may be split into multiple portions (e.g., the last portion of the pixel image signal that requires a first resolution analog-to-digital conversion operation, a count value portion generated by multiplying the final count value by a pre-determined digital output corresponding to an analog portion associated with the full target magnitude of allocated portions of each readout cycle, a residual value portion that requires a second resolution).

As an example, ADC circuitry 70 may include different ADC circuitry having different resolutions. In particular, ADC circuitry 70 may include a first n-bit portion (e.g., a portion of a first bit-resolution) that is used to perform conversion operations on the last portion of the pixel image signal. ADC circuitry 70 may include a second m-bit portion (e.g., a portion of a second bit-resolution). Bit resolutions n-bit and m-bit may be the same or different.

The examples of comparison circuitry 62 providing various control signals to other circuitry in column readout circuit 49 are merely illustrative. If desired, portions of control circuitry 44 in FIG. 2 and/or processing circuitry 44 in FIG. 1 may communicate with and/or include portions of comparison circuitry 62 to provide control and processing functions to column readout circuit 49 based on one or more outputs (e.g., a comparison output) of comparison circuitry 62.

Figure 5:
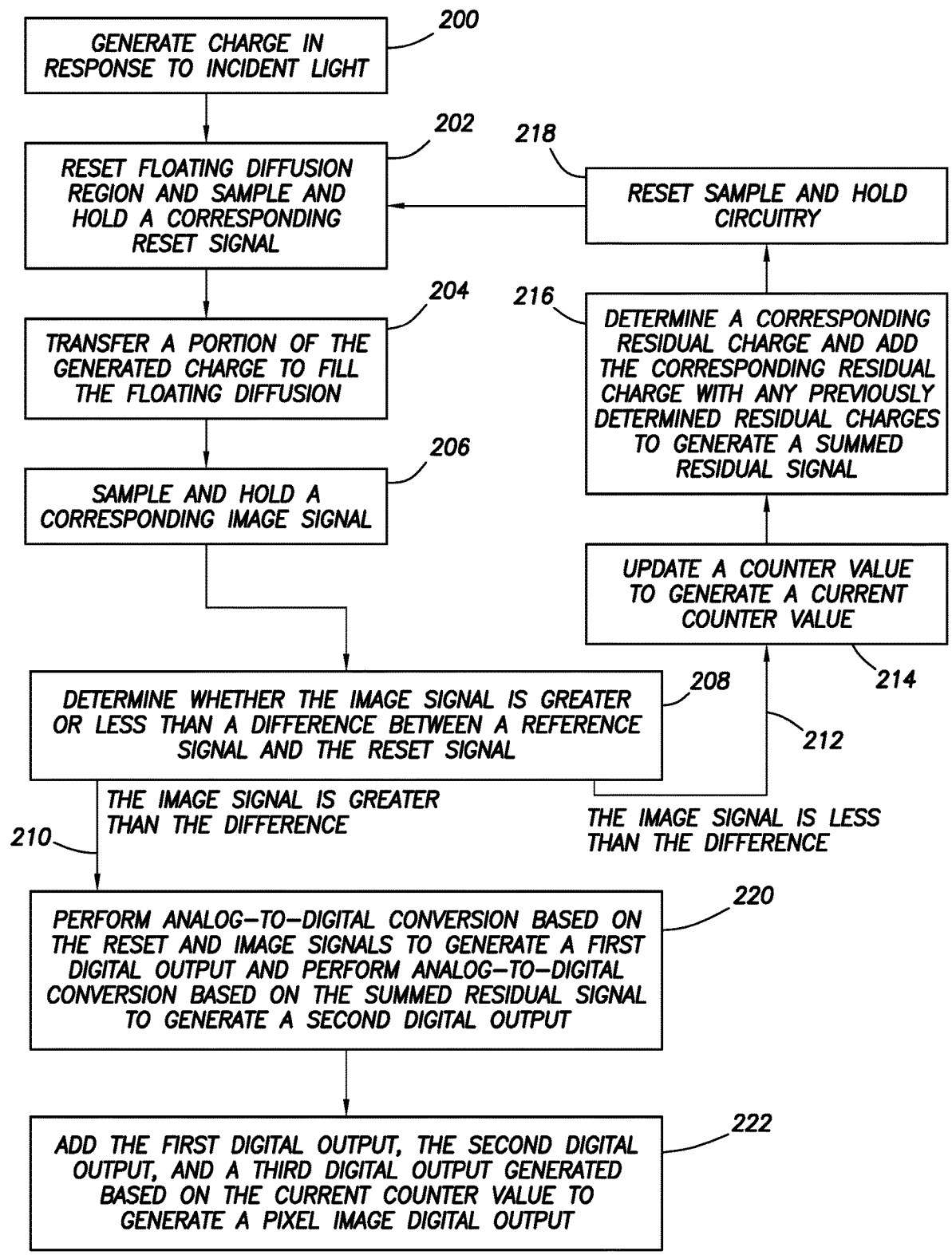
FIG. 5 is an illustrative flow chart for operating a system such as the system shown in FIG. 4 with extended high dynamic range functionalities in accordance with an embodiment.

FIG. 5 shows an illustrative flowchart that may be used to operate the image sensor system shown in FIG. 4. As an example, control and processing circuitry 44 in FIG. 2, processing circuitry 18 in FIG. 1, readout circuitry 48 in FIG. 1, and/or pixel 30 in FIG. 3 may process the steps of FIG. 4 and provide corresponding control signals. At step 200, a photosensitive element (e.g., photodiode 22 in FIG. 3) may generate charge in response to incident light. At step 202, a reset transistor (e.g., transistor 28 in FIG. 3) may be activated to reset a charge storage region (e.g., a floating diffusion 26 in FIG. 3) to a reset voltage level. Readout circuitry (e.g., sample and hold circuitry 60 in FIG. 4) may readout the reset voltage level as a reset signal and may temporarily store (e.g., sample and hold) the reset signal.

At step 204, a control signal may be asserted to partially activate a transfer transistor interposed between the photosensitive element and charge storage region (e.g., transistor 24 in FIG. 3). The partial activation of the transfer transistor may provide a target potential barrier (e.g., associated with a target swing voltage on pixel output line 72, associated with a target number electrons transferred to the charge storage region) between the photosensitive element and charge storage region, thereby transferring a portion of pixel image signal stored at the photosensitive element to the charge storage region. The control signal may transfer at least the target number of electrons (e.g., provide a voltage swing on pixel output line 72 of at most the target swing voltage). At step 206, readout circuitry (e.g., sample and hold circuitry 60 in FIG. 4) may readout the portion of the pixel image signal and may temporarily store (e.g., sample and hold) the portion of the pixel image signal.

At step 208, comparison circuitry (e.g., comparison circuitry 62 in FIG. 4) may determine whether the portion of the image signal is greater or less than a difference between a reference signal and reset signal (sometimes referred to herein as a threshold signal or a target swing signal). In other words, the comparison circuitry may determine whether the portion of the image signal voltage is greater than or less than the target swing voltage on the pixel output line associated with the target potential barrier established by the transfer transistor. If the image signal is greater than the difference (e.g., greater than the target swing voltage on the pixel output line), processing may proceed to step 220 via step 210. In this scenario, the portion of the image signal transferred to the charge storage region represents all of the remaining in the photosensitive element. At step 220, readout circuitry (e.g., ADC circuitry 70) may perform analog-to-digital conversion using the reset signal and the portion of the image signal currently stored at the sample and hold circuitry to generate a digital output. Because the portion read out represents the only portion of the pixel image signal, the generated digital output is the final digital output. As such, step 222 may be omitted in this scenario (e.g., where the counter value is zero and there is no accumulated residual value signal).

Referring back to step 208, if the image signal is less than the difference between the reference signal and the reset signal (e.g., less than the target swing voltage on the pixel output line), processing may proceed to step 214 via path 212. At step 215, readout circuitry (e.g., counter circuitry 68) may update a counter value to generate a current counter value. In particular, counter circuitry may update the counter value (e.g., may increment the counter value by one). At step 216, readout circuitry may determine a corresponding residual charge (e.g., a residual voltage that is the difference between the portion of the image signal and the targeted swing voltage on the pixel output line). The corresponding residual charge may be summed (e.g., added) to any previously stored residual charge values to generate a summed residual signal and the readout circuitry may store the summed residual value until ADC conversion is required. At step 218, portions of the readout circuitry (e.g., sample and hold circuitry 60) may be reset in preparation for reading out additional portions of the pixel image signal. If desired, one or more steps 214, 216, and 218 may occur simultaneously.

Processing may then loop back to step 202. Steps 202, 204, 206, 208, 214, 216, and 218 may be repeated in as many cycles as necessary until processing proceeds along path 210 to step 220. In a multi-portion readout of the pixel image signal, at step 220, readout circuitry (e.g., ADC circuitry 70) may perform analog-to-digital conversion using the last sampled and held reset and image signals (e.g., corresponding to the last portion of the image signal read out) to generate a first digital output. At step 220, readout circuitry (e.g., ADC circuitry 70) may perform analog-to-digital conversion using the summed residual signal to generate a second digital output. At step 222, a summation circuit may add the first digital output, the second digital output, and a third digital output generated based on the current counter value to generate a final pixel image digital output.

The system of FIG. 4 and the steps of FIG. 5 are merely illustrative. If desired, additional circuitry provided in addition to or in place of various circuitry described in FIG. 4. The additional circuitry may provide similar functionalities as those of the circuitry described in FIG. 4 and/or different functionalities that extend the operation of the system. If desired, one or more steps of FIG. 5 may be omitted or replaced with other suitable processing operations. Additional steps may also be added to FIG. 5, if suitable. Pixels 30 in other columns may be coupled to similar column readout circuitry and may perform similar operations.

By using the illustrative system and steps in FIGS. 4 and 5, respectively, an imaging system may be configured to generate HDR images based only on a single frame capture. Essentially, the imaging system extends the dynamic range of the pixel using the readout circuit by reading out bright spots in multiple portions and dark scenes in a single portion with a high-resolution analog-to-digital conversion. The readout circuit may be configured to be used with any suitable pixel configuration as the readout scheme is not affected by components within the pixel.

Figure 6:
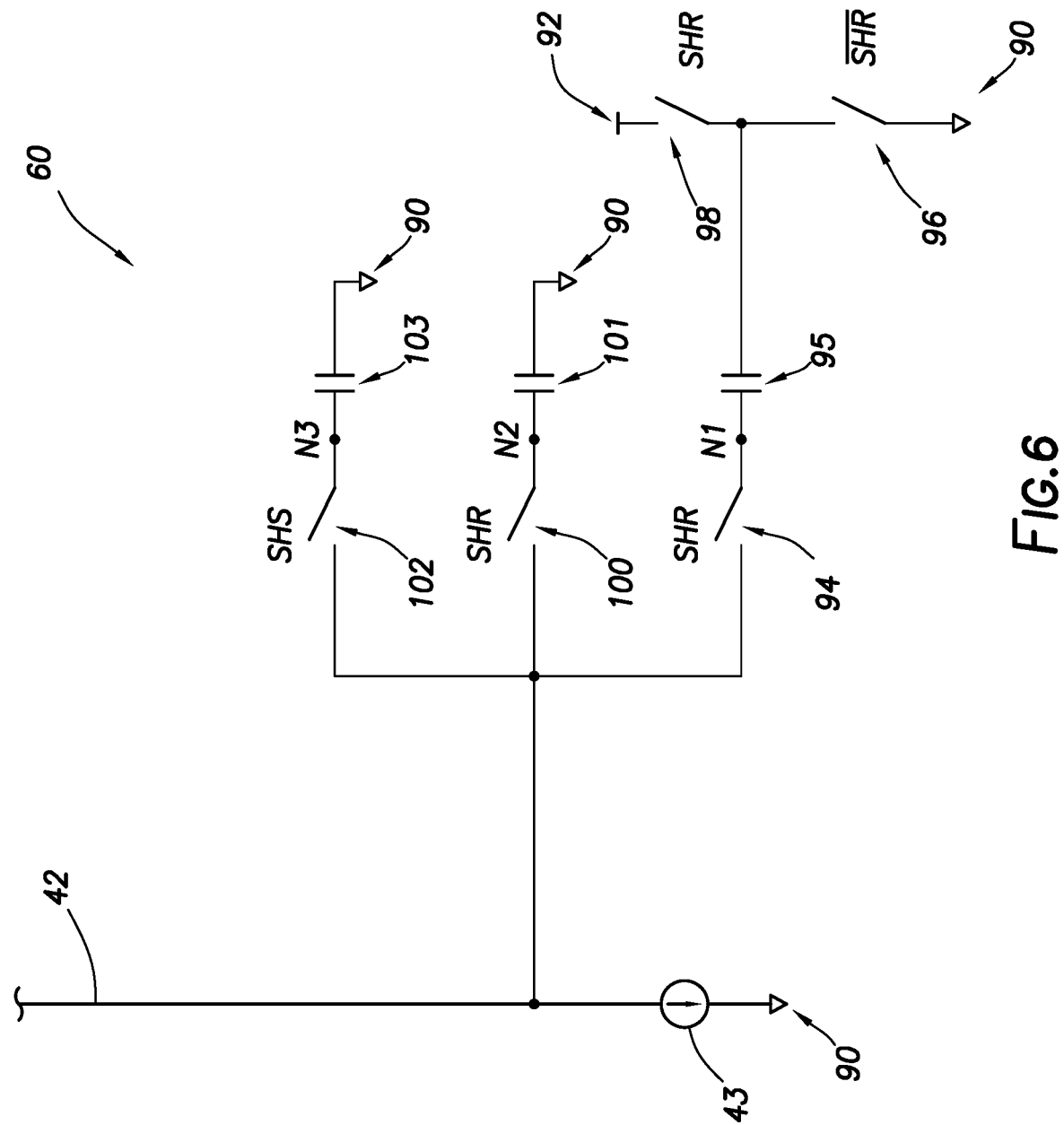
FIG. 6 is a circuit diagram of illustrative sample and hold circuitry in readout circuitry such as the readout circuitry shown in FIG. 4 in accordance with an embodiment.

FIG. 6 shows an illustrative sample and hold circuit that may be used in the system in FIG. 4 as sample and hold circuitry 60. In particular, sample and hold circuitry may include three parallel paths along which capacitors 95, 101, and 103 are coupled. Capacitors 101 and 103 may have respective first terminal coupled to a ground terminal (e.g., ground terminal 90, which may be coupled to voltage Vss in FIG. 3). Second terminals of capacitors 101 and 103 may be coupled to pixel column output line 42 via respective switches 100 and 102. Capacitor 95 may have a first terminal that is switchably coupled to one or terminals 90 and 92 via respective switches 96 and 98. Terminal 90 may receive a ground voltage while terminal 92 may receive a reference voltage. The reference voltage received a terminal 92 may be the target swing voltage described in connection with FIGS. 4 and 5. Capacitor 95 may have a second terminal coupled to output line 42 via switch 94. Current source 43 may be coupled to line 42 to drive signals off pixels in the pixel column.

Signal SHR may control switches 94, 96, 98, and 100. In particular, when signal SHR is asserted switches 94, 98, and 100 maybe closed to electronically connect their respective opposing terminals. By closing switch 94, the second terminal of capacitor 95 may be at a reset signal voltage level, and by closing switch 98, the first terminal of capacitor 95 may be at a reference signal voltage level. Therefore, capacitor 95 may store a different signal voltage level between the reset voltage level and the reference voltage level. When signal SHR is deasserted, switch 96 may be closed to electrically connect its respective opposing terminals, thereby shifting the difference voltage level relative to a grounding voltage level. By closing switch 100, capacitor 101 may store the reset voltage level. Signal SHS may similarly control switch 102 (e.g., when signal SHS is asserted, at least a portion of an image signal may be stored at capacitor 103). Nodes N1, N2, and N3 may respectively provide the difference voltage level, the reset voltage level, and the current portion of the pixel image voltage level.

Figure 7:
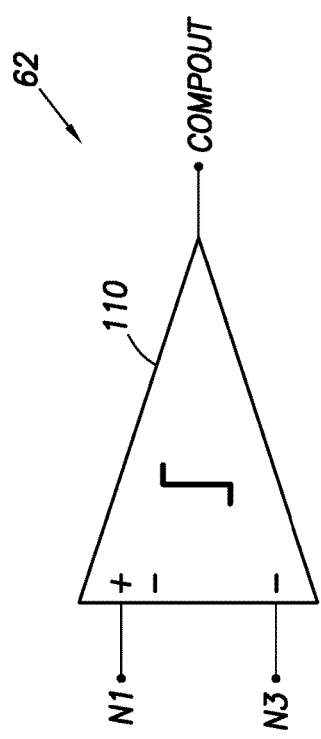
FIG. 7 is a circuit diagram of illustrative comparison circuitry in readout circuitry such as the readout circuitry shown in FIG. 4 in accordance with an embodiment.

FIG. 7 shows an illustrative comparison circuit that may be used in the system in FIG. 4 as comparison circuitry 62. In particular, comparison circuitry 62 may include comparator 110 (e.g., an integrating analog comparator). Comparator 110 may receive the difference voltage level at a first terminal (e.g., at a positive input terminal) and the current portion of the pixel image voltage level at a second terminal (e.g., at a negative input terminal). As an example, the positive input terminal of comparator 110 may be coupled to node N1 in FIG. 6 and the negative input terminal of comparator 110 may be coupled to node N3 in FIG. 6. Comparator 110 may compare the inputs and generate a comparison output (e.g., output signal COMPOUT). As an example, output signal COMPOUT may be at a high value when the positive terminal input (e.g., the difference voltage level) is greater than the negative terminal input (e.g., the current portion of the pixel image voltage level) and at a low value when the negative terminal input is greater than the positive terminal input.

Figure 8:
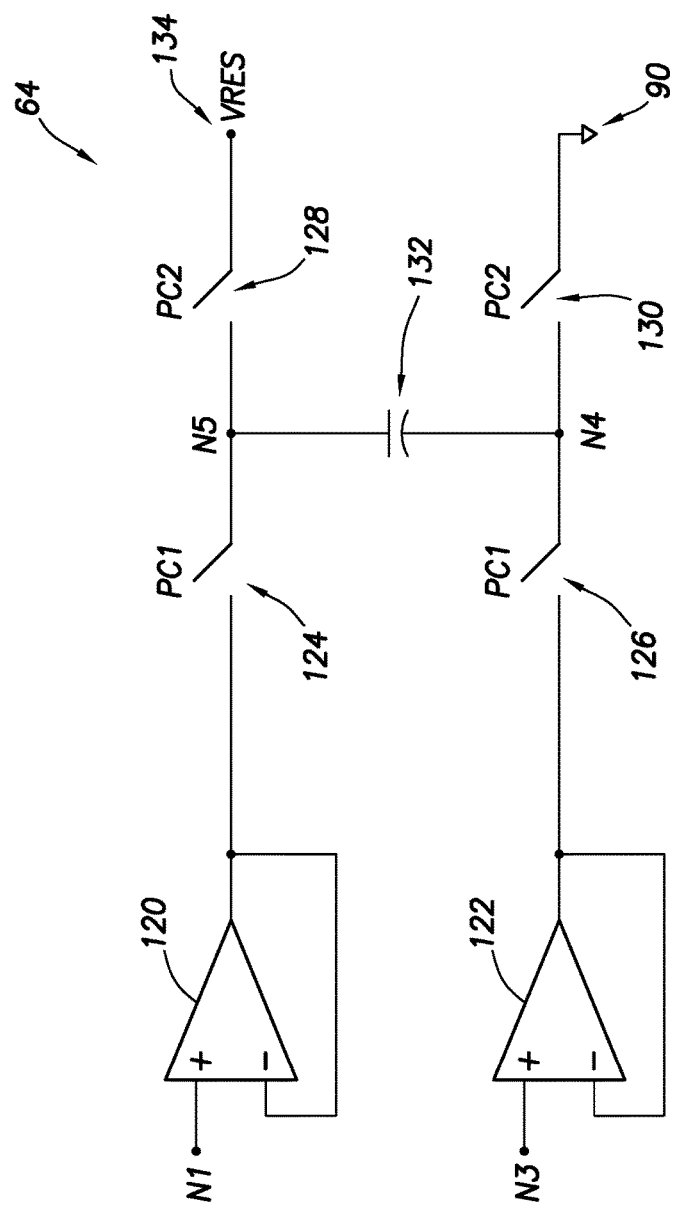
FIG. 8 is a circuit diagram of illustrative residual voltage measurement circuitry in readout circuitry such as the readout circuitry shown in FIG. 4 in accordance with an embodiment.

FIG. 8 shows an illustrative residual voltage measurement circuit that may be used in the system in FIG. 4 as residual measurement circuitry 64. As an example, measurement circuitry 64 may be activated when output signal COMPOUT (in FIG. 7) is at a high value. In particular, measurement circuitry 64 may include operational amplifiers 120 and 122, which respectively receive the difference voltage level and the current portion of the pixel image voltage level at their corresponding positive input terminals. Amplifiers 120 and 122 may each have a negative input terminal coupled to its output terminal. Measurement circuitry 64 may include capacitor 132 coupled between nodes N4 and N5. Node N4 may be interposed between switches 126 and 130, while node N5 may be interposed between switches 124 and 128. Switch 124 may couple amplifier 120 to node N5. Switch 126 may couple amplifier 122 to node N4. Switch 128 may couple node N5 to terminal 134. Switch 130 may couple node N4 to terminal 90.

Control signal PC1 may control switches 124 and 126. When control signal PC1 is asserted to close switches 124 and 126, amplifiers 120 and 122 may provide voltage levels corresponding to nodes N1 and N3 to corresponding nodes N5 and N4. Control signal PC2 may control switches 128 and 130. When control signal is deasserted and control signal PC2 is asserted, terminal 90 may shift node N4 to a grounding voltage. Because the potential difference across capacitor 132 is maintained, the difference signal voltage level VRES (sometimes referred to herein as the residual voltage signal) may be generated at terminal 134.

Figure 9:
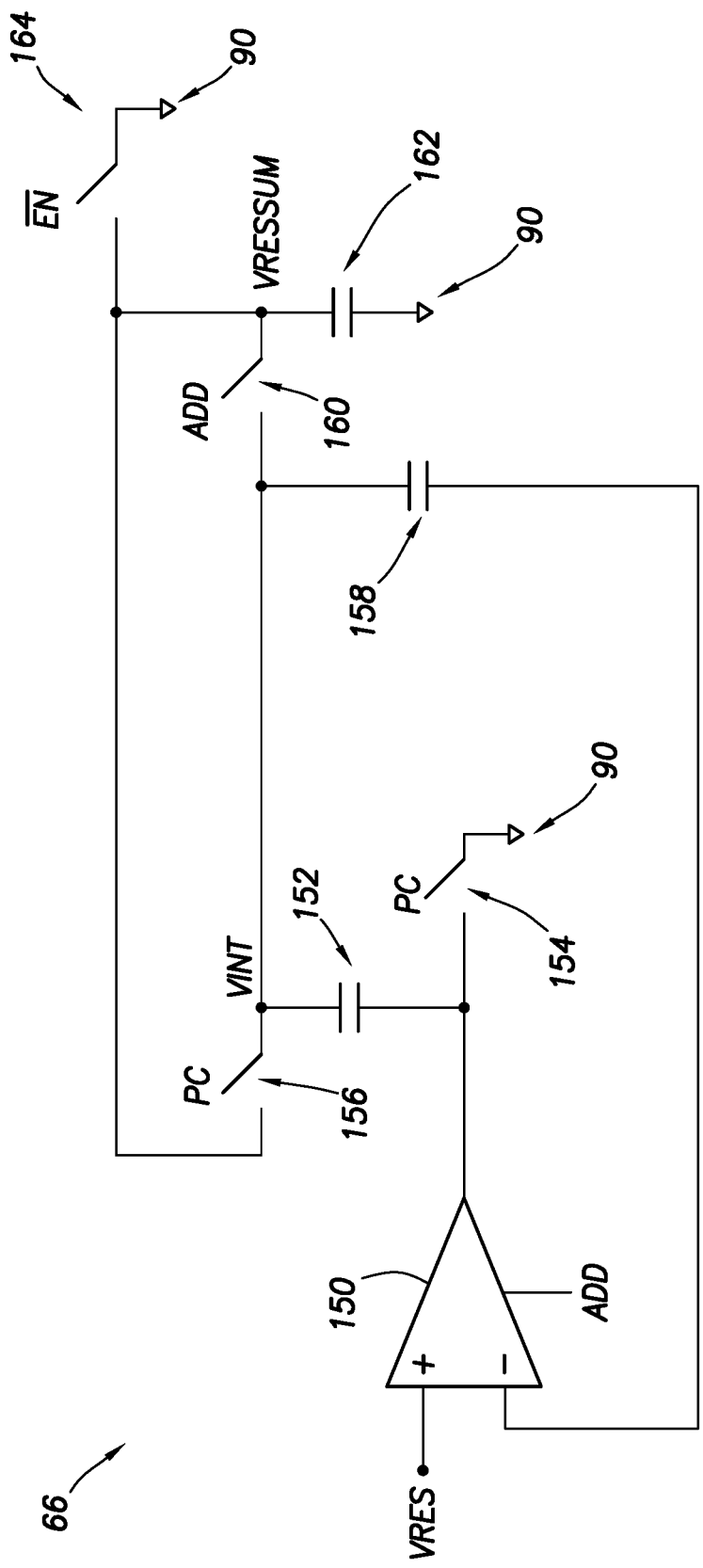
FIG. 9 is a circuit diagram of illustrative residual voltage summation circuitry in readout circuitry such as the readout circuitry shown in FIG. 4 in accordance with an embodiment.

FIG. 9 shows an illustrative residual voltage accumulation circuit that may be used in the system in FIG. 4 as residual summation circuitry 66. In particular, residual summation circuitry 66 may include operational amplifier 150 that has a first positive terminal coupled to an input signal (e.g., residual voltage signal VRES in FIG. 8) and a second negative terminal coupled to a first terminal of capacitor 158. Operational amplifier 150 may have an output terminal coupled to a first terminal of capacitor 152. The output terminal may be coupled to ground terminal 90 via switch 154. Operational amplifier 150 may receive a control signal ADD, when asserted configures summation circuitry 66 to add the currently received residual voltage signal input to the previously stored residual voltages.

Capacitor 152 may have a second terminal coupled to node VINT. Node VINT may be coupled to the second terminal of capacitor 158. Node VINT may be coupled to node NRESSUM via two parallel paths. Switch 156 may couple node VINT to VRESSUM. Switch 160 may also couple VINT to VRESSUM. Capacitor 162 may be coupled between node VRESSUM and grounding terminal 90. Switch 164 may be coupled between VRESSUM and grounding terminal 90.

Control signal EN may be deasserted to keep switch 164 in an open state when residual summation circuitry 66 is actively accumulating residual signals. As such, a summed residual signal maybe stored at node VRES by capacitor 162. To accumulate residual signals from the various portions of the pixel image signal read out, control signal PC may be asserted to transfer the voltage stored across capacitor 162 to capacitor 152. Subsequently, control signal PC may be deasserted and control signal ADD asserted to activate amplifier 150 and add the signal VRES to capacitor 162. This pair of control signal assertions (e.g., asserting control signal PC, then subsequently control signal ADD) may be repeatedly used as necessary to accumulate any suitable number of residual voltage signals generated from corresponding readout portions of the pixel image signal.

The exemplary circuits shown in FIGS. 6-9 are merely illustrative. If desired, any suitable circuits may be used to implement the circuitry of the system in FIG. 4. For example, different combinations and configurations using various storage circuits, switching circuits, comparison circuits, transistor circuits, power supply circuits, and other circuits may be used to implement the system in FIG. 4.

Figure 10:
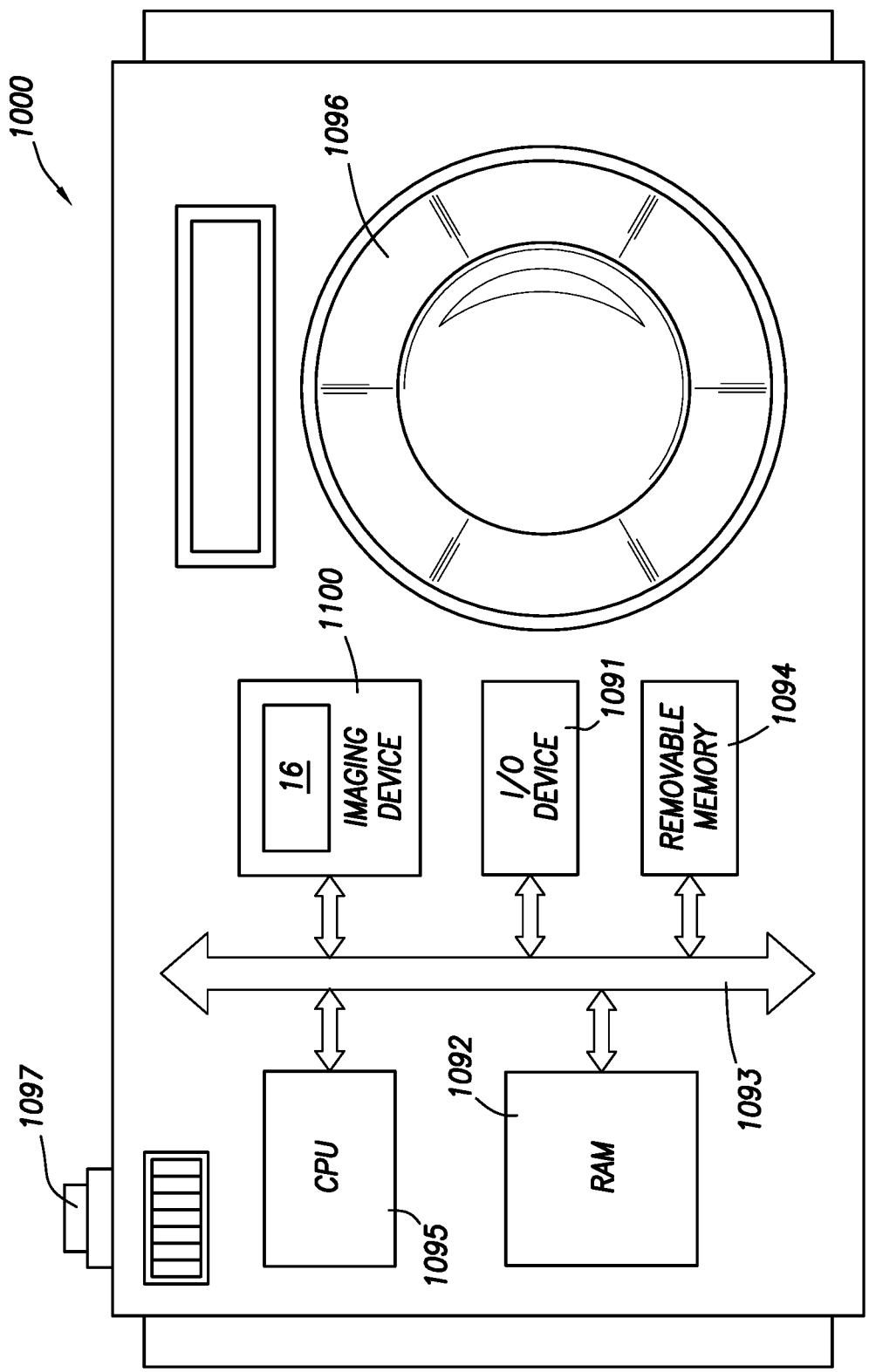
FIG. 10 is a block diagram of an illustrative image capture and processor system employing the embodiments of FIGS. 1-9 in accordance with an embodiment.

FIG. 10 shows in simplified form a typical image capture and processor system 1000, such as a digital camera, which includes an imaging device 1100 (e.g., an imaging device 1100 such as image sensor 16 of FIGS. 1-9 employing pixels 30 coupled to column readout circuitry 49). The processor system 1000 is exemplary of a system having digital circuits that could include imaging device 1100. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The image capture and processor system 1000 generally includes a lens 1096 for focusing an image on pixel array 20 of device 1100 when a shutter release button 1097 is pressed, central processing unit (CPU) 1095, such as a microprocessor which controls camera and one or more image flow functions, which communicates with one or more input/output (I/O) devices 1091 over a bus 1093. Imaging device 1100 also communicates with the CPU 1095 over bus 1093. The system 1000 also includes random access memory (RAM) 1092 and can include removable memory 1094, such as flash memory, which also communicates with CPU 1095 over the bus 1093. Imaging device 1100 may be combined with the CPU, with or without memory storage on a single integrated circuit or on a different chip. Although bus 1093 is illustrated as a single bus, it may be one or more busses or bridges or other communication paths used to interconnect the system components.

In various embodiments, an image sensor may include an array of image sensor pixels arranged in columns and rows. A column readout circuit may be coupled to each column of image sensor pixels via a respective column pixel output line. The column readout circuit may include sample and hold circuitry configured to store a reset readout voltage and an image readout voltage, residual voltage accumulation circuitry configured to store a sum of residual voltages, and counter circuitry configured to store and update a count value. The column readout circuit may also include analog-to-digital conversion circuitry configured to generate a first digital value based on the reset and image readout voltages and a second digital value based on the sum of residual voltages. The column readout circuit may include digital addition circuitry coupled to the analog-to-digital conversion circuitry and configured to combine the first digital value, the second digital value, and a third digital value generated based on the count value stored at the counter circuitry.

The sample and hold circuitry may receive a reference voltage that is used to determine a target swing voltage at the pixel output line (e.g., by subtracting the reference voltage from a reset voltage). The readout circuit may perform readout operations on an image signal generated by a given pixel based on the target swing voltage to generate a pixel readout voltage. Comparison circuitry may compare the pixel readout voltage to the target swing voltage to determine whether additional portions of the image signal remain in the given pixel. In response to determining that no additional portion of the image signal remain in the given pixel, analog-to-digital conversion circuitry may perform conversion operations based on the reset and image readout voltages currently stored at the sample and hold circuitry. In response to determining that additional portions of the image signal remain in the given pixel, residual voltage measurement circuitry may generate a residual value to be stored and accumulated with possible additional residual voltages to generate a summed residual voltage, counter circuitry may increment the stored counter value, and sample and hold circuit may reset the storage circuits corresponding to the image readout voltage and the reset readout voltage. Readout circuitry may continue to perform these operations when at least one addition portion of the image signal remain in the given pixel.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
an image pixel having a photosensitive element configured to generate charge in response to incident light, wherein the image pixel is operable to generate a plurality of output signals, each associated with a different portion of the generated charge and collectively associated with an image signal; and
a column readout circuit coupled to the image pixel via an output line, wherein the column readout circuit is configured to separately receive each of the plurality of output signals and the column readout circuit includes:
comparison circuitry operable to perform separate comparison operations based on each of the plurality of output signals; and
summation circuitry configured to receive signals representing the plurality of output signals and to combine the signals to generate the image signal, wherein the summation circuitry includes digital summation circuitry, and the received signals include three different digital signals representing the plurality of output signals, and wherein one of the received signals is generated based on results of the comparison operations.

2. The image sensor defined in claim 1, wherein the column readout circuit is operable to perform a separate sample and hold operation on each of the plurality of output signals, and wherein the column readout circuit includes counter circuitry configured to store a count value based on a number of output signals in the plurality of output signals, on which the column readout circuit has performed the sample and hold operations.

3. The image sensor defined in claim 1, wherein the column readout circuit includes sample and hold circuitry that performs sample and hold operations and wherein the sample and hold circuitry receives a reference voltage level that is different than a ground voltage level.

4. The image sensor defined in claim 3, wherein the comparison circuitry is configured to perform a comparison operation based on the reference voltage level and a voltage level associated with a given one of the plurality of output signals to generate a corresponding comparison output.

5. The image sensor defined in claim 1, wherein the column readout circuit includes sample and hold circuitry configured to store an image signal voltage level associated with the plurality of output signals at a first storage circuit, a reset signal voltage level at a second storage circuit, and a threshold signal voltage level at a third storage circuit.

6. The image sensor defined in claim 5, wherein the comparison circuitry is coupled to the sample and hold circuitry and is operable to perform a comparison operation between the image signal voltage level and the threshold signal voltage level to generate a corresponding comparison output.

7. The image sensor defined in claim 6, wherein the column readout circuit includes residual voltage measurement circuitry coupled to the comparison circuitry and operable to generate a residual voltage level based on the image signal voltage level and the threshold signal voltage level.

8. The image sensor defined in claim 7, wherein the column readout circuit includes residual voltage accumulation circuitry coupled to the residual voltage measurement circuitry and configured to store the generated residual voltage level and to generate a summed residual voltage level by adding the generated residual voltage level with previously generated residual voltage levels.

9. The image sensor defined in claim 8, wherein the column readout circuit includes counter circuitry coupled to the comparison circuitry and operable to update a stored counter value based on a number of output signals in the plurality of output signals received by the column readout circuit.

10. A system, comprising:
processing circuitry;
input-output circuitry;
an array of image sensor pixel that includes a given image pixel having a photodiode configured to generate an image signal in response to incident light, a floating diffusion region, and a transistor interposed between the photodiode and the floating diffusion region; and
a readout circuit coupled to the given image pixel via a pixel output line, wherein the transistor is operable to separate the image signal into a plurality of portions based on a target swing voltage, wherein the readout circuit is operable to perform a readout operation on an image readout voltage at the pixel output line corresponding to at least a portion of the image signal and to compare the image readout voltage with the target swing voltage, and wherein the readout circuit includes sample and hold circuitry configured to store the image readout voltage, a reset readout voltage, and the target swing voltage.

11. The system defined in claim 10, wherein the readout circuit includes comparison circuitry operable to determine whether any portion in the plurality of portions of the image signal remains in the photodiode.

12. The system defined in claim 11, wherein the comparison circuitry is coupled to the sample and hold circuitry and is configured to receive the image readout voltage and the target swing voltage and generate a comparison output by comparing the image readout voltage to the target swing voltage.

13. The system defined in claim 12, wherein the readout circuit includes residual voltage measurement circuitry operable to generate a residual voltage based on the comparison output and includes residual voltage summation circuitry configured to store the generated residual voltage.

14. The system defined in claim 13, wherein the readout circuit includes counter circuitry configured to generate a count value based on the comparison output.

15. The system defined in claim 14, wherein the readout circuit includes analog-to-digital conversion circuitry coupled to the residual voltage summation circuitry, the counter circuitry, and the sample and hold circuitry.

16. An image sensor, comprising:
an array of image pixels; and
a column readout circuit coupled to a column of image pixels in the array of image pixels via a column line, wherein the column readout circuit comprises:
sample and hold circuitry configured to store a reset readout voltage and an image readout voltage;
residual voltage accumulation circuitry configured to store a sum of residual voltages; and
counter circuitry configured to store a count value.

17. The image sensor defined in claim 16, wherein the column readout circuit comprises:
analog-to-digital conversion circuitry configured to generate a first digital value based on the reset and image readout voltages and a second digital value based on the sum of residual voltages; and
addition circuitry coupled to the analog-to-digital conversion circuitry and configured to combine the first digital value, the second digital value, and a third digital value generated based on the stored count value.

* * * * *